United States Patent [19]

Taniguchi et al.

[11] 4,456,993

[45] Jun. 26, 1984

[54] DATA PROCESSING SYSTEM WITH ERROR PROCESSING APPARATUS AND ERROR PROCESSING METHOD

[75] Inventors: Shozo Taniguchi, Minato; Osamu Shinke; Masami Ishii, both of Kawasaki; Shinichi Kubo, Arakawa, all of Japan

[73] Assignee: Fujitsu Limited, Kawasaki, Japan

[21] Appl. No.: 247,297

[22] PCT Filed: Jul. 29, 1980

[86] PCT No.: PCT/JP80/00175
§ 371 Date: Mar. 30, 1981
§ 102(e) Date: Mar. 30, 1981

[87] PCT Pub. No.: WO81/00481
PCT Pub. Date: Feb. 19, 1981

[30] Foreign Application Priority Data
Jul. 30, 1979 [JP] Japan .................. 54-97111

[51] Int. Cl.³ .................................. G06F 11/10
[52] U.S. Cl. ....................... 371/10; 364/200; 371/13; 371/38
[58] Field of Search ............... 371/10, 13, 38; 364/200 MS File, 900 MS File

[56] References Cited

U.S. PATENT DOCUMENTS

| | | | |
|---|---|---|---|
| 3,735,105 | 5/1973 | Maley | 371/38 |
| 3,748,653 | 7/1973 | Debruyne et al. | 371/10 |
| 3,992,702 | 11/1976 | Bailey | 365/200 |
| 4,051,461 | 9/1977 | Hashimoto et al. | 364/200 |
| 4,093,985 | 6/1978 | Das | 364/200 |
| 4,175,692 | 11/1979 | Watanabe | 371/13 |
| 4,255,808 | 3/1981 | Schaber | 371/13 |
| 4,319,357 | 3/1982 | Bossen | 371/38 |

Primary Examiner—Charles E. Atkinson
Attorney, Agent, or Firm—Staas & Halsey

[57] ABSTRACT

A data processing system for error processing and an error processing method, which system includes a main memory (M), an information processing unit (A), an error processing unit (EP) and an alternate memory. When an error arises in a portion of the main memory, corrected information is stored in the alternate memory. Then, under the control of the error processing unit, the alternate memory is employed instead of the malfunctioning portion of the main memory. The alternate memory is adapted to be used only when the error is a fixed error or a burst error, in order to avoid a system shut-down caused by fixed-and soft-errors or burst-and soft-errors which occur during information processing. The alternate memory, therefore, is not used in a case where the error is a soft error. This imparts an additional advantage in that the size of the memory is reduced.

19 Claims, 20 Drawing Figures

| Fig. 2 | |
|---|---|
| Fig. 2A | Fig. 2B |

⟨ DC ⟩

(SM)

(WS)

( RS )

⟨ MPX ⟩

Fig. 12 (AS)
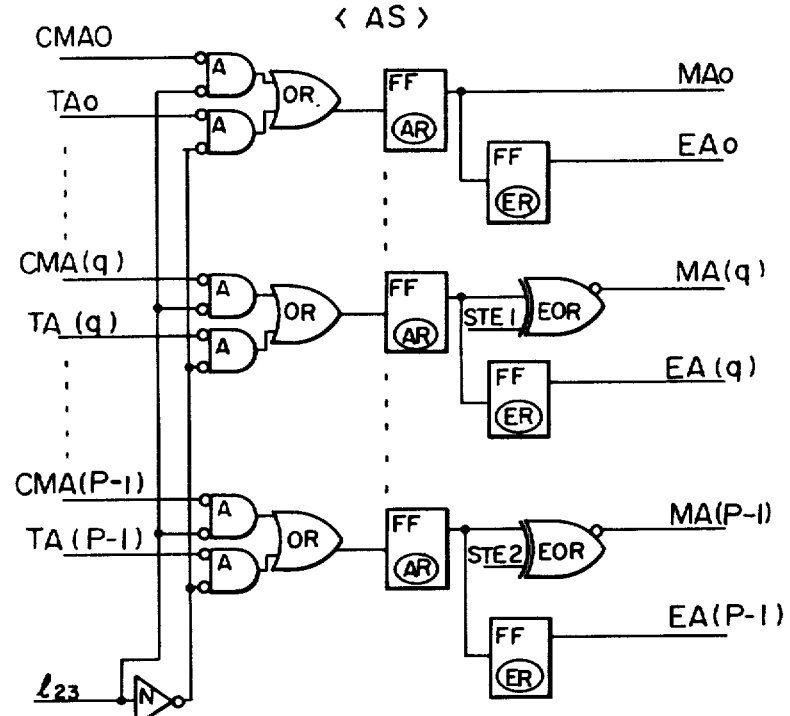
Fig. 13 (SS)
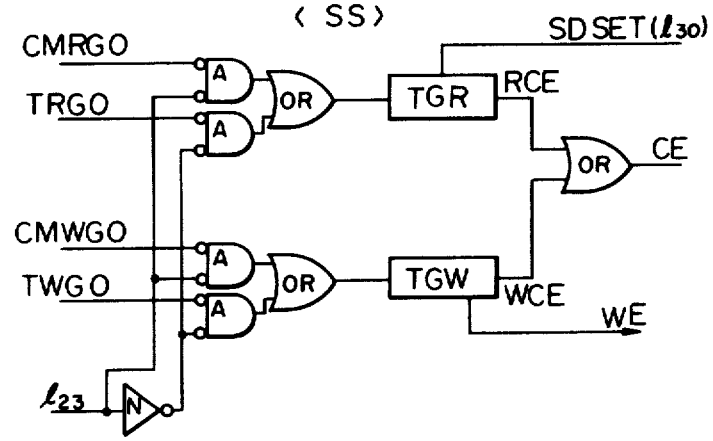

DATA PROCESSING SYSTEM WITH ERROR PROCESSING APPARATUS AND ERROR PROCESSING METHOD

BACKGROUND OF THE INVENTION

This invention relates to a data processing system with an error processing device and an error processing method. More particularly, to an error processing system and method in a data processing system in which, when an error occurs in a main memory, an alternate memory is used in place of the main memory.

A data processing system such as a computer comprises a main memory for storing data and a data processing unit. The data processing unit reads data from the main memory by accessing the main memory. By using the read data, the data processing unit executes data processing. In order to execute accurate data processing, the data to be supplied from the main memory to the data processing unit must be accurate. However, there may be hard errors or soft errors in the main memory. The hard errors occur due to a permanent destruction of a part of the main memory. The soft errors occur, particularly in a semiconductor memory element, due to alpha particles or internal voltage variations within a memory cell. In order to avoid the soft errors and hard errors, there is generally provided an error correcting circuit in the data processing system. One example of the error correcting circuit is the well known SEC-DED (Single Error Correct-Double Error Detect) circuit. By means of the SEC-DED circuit, a one bit error in a bit line or a word line in the main memory can be corrected by rewriting correct data but two or more bit errors in a bit line or word line in the main memory cannot be corrected. When two or more bit errors are detected, the data processing system changes to a system down status. Similarly, in the other error correcting circuits, correctable errors are also corrected, but uncorrectable errors are only detected in order to cause a system down status. A soft error is an accidental inversion of the polarity of data stored in a memory cell of the main memory. Therefore, the soft error can be corrected by rewriting correct data into the memory cell.

However, in recent years, the memory capacity of the main memory has been increased by means of, for example, decreasing the size of each memory cell in the a semiconductor memory element. Because of the decreased memory cell size, the possibility of soft errors occuring due to alpha particles is increased. Those alpha particles, which are radiated from package materials, temporarily turn off dynamic nodes of a semiconductor memory cell. Therefore, in spite of the functioning of the error correcting circuit, the possibility of an uncorrectable error occuring is increased because of the increase in the frequency of soft errors. As a result, the possibility of the system down status occuring is increased.

In order to decrease the possibility of the system down status occuring, errors may be removed before the data processing unit accesses the main memory. For this purpose, the data processing system may further comprise an error processing unit and an alternate memory. The error processing unit can access the main memory when the data processing unit does not access the main memory. The correctness of data stored in the main memory is checked by the error processing unit. If there are one or more errors in the stored data, the errors are analyzed by the error processing unit. As a result of the analysis, if the errors are uncorrectable, correct data is stored in the alternate memory. Then, the correct data stored in the alternate memory is used in the data processing after the end of operation by the error processing unit. By means of this modified system, correctable errors are removed before the data processing unit accesses the main memory. Therefore, the possibility of a system down status occuring is decreased. However, a system down status still occurs when uncorrectable errors, such as, two or more bit errors in the SEC-DED circuit, occur during the time the data processing unit accesses the main memory. When, for example, the SEC-DED circuit is used as an error correcting circuit, these uncorrectable errors may occur not only when two or more bits of hard error occur, but also when two or more soft bit errors occur, one bit hard error plus one or more bit soft errors occur, or a burst error plus one soft error occurs, during the time data processing is executed. Burst error means hard errors in a plurality of memory cells in one or more chips in the main memory.

SUMMARY OF THE INVENTION

An object of the present invention is to provide a data processing system which is free from a system down status due to a hard error plus soft error, or due to a burst error plus soft error, during data processing.

Another object of the present invention is to provide a data processing system having a main memory and an alternate memory, the alternate memory being used only when a hard error occurs.

Still another object of the present invention is to provide a data processing system having a main memory and an alternate memory, the size of the alternate memory being decreased with respect to the size of the alternate memory in the prior art.

Still another object of the present invention is to provide an error processing method for avoiding the system down status due to a hard error plus a soft error, or due to a burst error plus a soft error during data processing.

According to the present invention, there is provided a data processing system having a main memory;

a data processing unit for processing data stored in said main memory;

an error processing unit for processing error data read from said main memory, said data processing unit being stopped from accessing said main memory during the time said error processing unit is accessing said main memory, said error processing unit including an error storing means for storing an error data read from said main memory;

an error informing means for informing said error storing means of said error data;

a data correcting means for correcting error data read from said main memory so as to output a corrected data when said error data is detected in the data read from said main memory;

an alternate memory for storing said corrected data under the control of said error processing means;

an access determining means included in said error processing unit for determining whether said error processing unit should access said main memory in response to said error data stored in said error storing means;

an error analyzing means for analyzing error data read from said main memory;

an alternate-operation control means for determining whether said corrected data should be stored in said alternate memory in response to the result of the analysis by said error analyzing means and a data switching means for transferring said corrected data stored in said alternate memory to said data processing unit after the end of the alternate operation by said error processing unit.

There are two modes of operation in the data processing system according to the present invention. The first mode occurs when the error processing unit accesses the main memory during a regular routine. In this mode, the data stored in the main memory is checked periodically by the error correcting circuit regardless of whether the data processing unit accesses the main memory. The second mode occurs when an error occurs during the time the data processing unit accesses the main memory. In this second mode, the data processing unit is stopped from accessing the main memory so that the right of memory control is transferred from the data processing unit to the error processing unit. In both modes, the data processing unit is inhibited from accessing the main memory.

In both modes of operation, when no error is detected with respect to an address in the main memory by the error correcting circuit, the next address of the main memory is checked. When an error is detected and when this error can be corrected by the error correcting circuit, one of the following two operations (1) and (2) is selected.

(1) After rewriting correct data into the same address of the main memory where the error has been detected, the error processing unit again accesses the same address. Then:
  (a) if the same error is detected, the error is recognized as a hard error of the main memory; and
  (b) if no error is detected, the previously detected error is recognized as a soft error.

(2) The error processing unit accesses a plurality of addresses neighboring the error address. Then:
  (a) if the same type of errors are detected by the error processing unit, these errors are recognized as a burst error; and
  (b) if the same type of error is not detected, the previously detected error is recognized as a soft error.

In both modes of operation, when an uncorrectable error is detected, one of the following two operations (3) and (4) is selected.

(3) The error processing unit ignores the uncorrectable error because the uncorrectable error will cause a system down status to occur after the right of memory control is transferred from the error processing unit to the data processing unit.

(4) The error processing unit accesses again the same address where the error has been detected. Then:
  (a) if the same error is detected, the error is recognized as an uncorrectable hard error; and
  (b) if no error is detected, the previously detected uncorrectable error is recognized as a soft error.

After the error is recognized as a hard error, a soft error, or a burst error, as mentioned above, the error processing unit controls the alternate memory in one of the following three ways (5) through (7).

(5) The error-bit data is corrected and stored in the alternate memory only when the error is recognized as a correctable hard error.

(6) The error-bit data is corrected and stored in the alternate memory only when the error is recognized as a correctable burst error.

(7) The error-bit data is corrected and stored in the alternate memory only when the error is recognized as a correctable hard error or a correctable burst error.

After the error is corrected and stored in the alternate memory, or is recognized as a soft error or an uncorrectable hard error, the right of memory control is transferred from the error processing unit to the data processing unit. Then, the data processing unit occupies or accesses the main memory. After this, the corrected data stored in the alternate memory is used instead of the error data stored in the main memory by using a switching operation.

The foregoing objects and other objects, as well as the characteristic features, of the present invention will become more apparent and more readily understandable from following description with reference to the accompanying drawings;

BRIEF DESCRIPTION OF THE DRAWINGS

FIGS. 7 through 13 are logic circuit diagrams for a data correcting circuit DC, a syndrome memory SM, the write data selecting circuit WS, a read data selecting circuit RS, a multiplexer MPX, an address selecting circuit AS, and a start signal selecting circuit SS, respectively, all of which are included in the system of FIG. 1;

DESCRIPTION OF THE PREFERRED EMBODIMENTS

Figure 1:
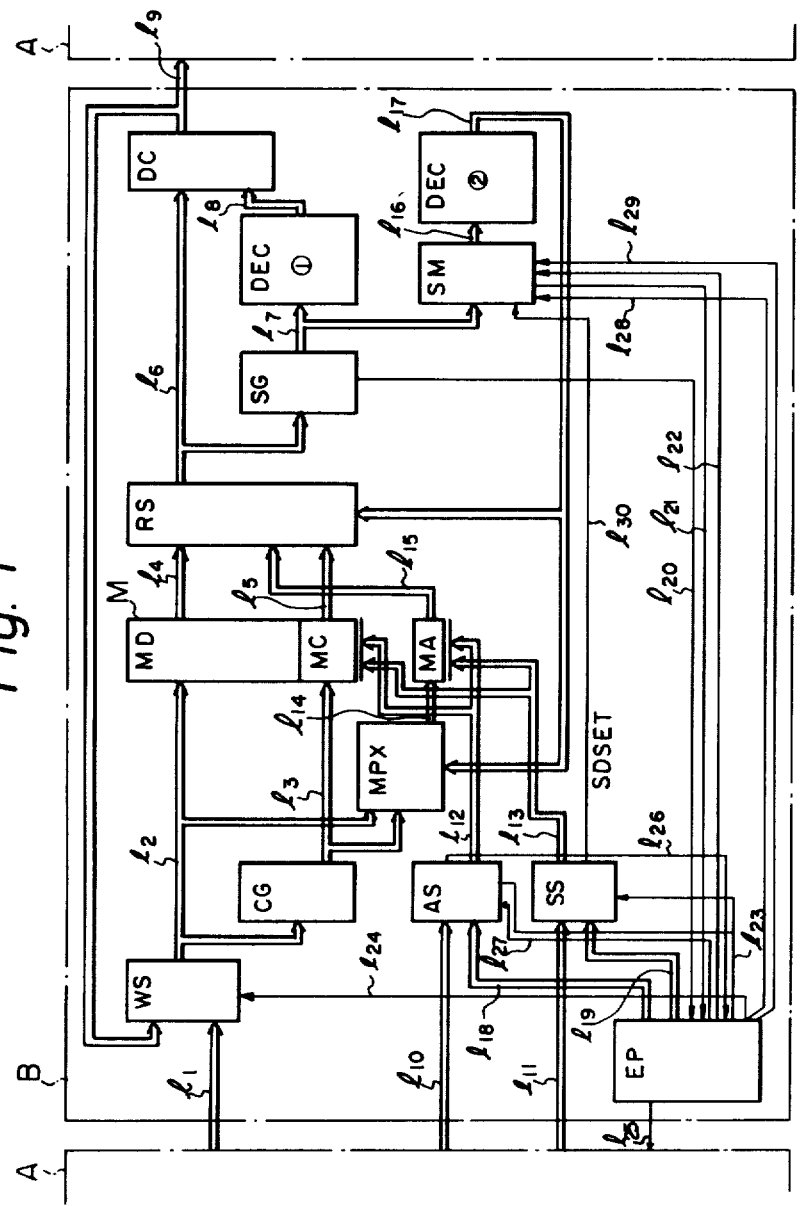
FIG. 1 is a block diagram illustrating a data processing system according to one embodiment of the present invention.

Referring to FIG. 1, a data processing system according to one embodiment of the present invention comprises a data processing unit A, such as a central processing unit, and a memory storage unit B. The memory storage unit B includes a main memory M and an alternate memory MA. The main memory M comprises a data-bit storing part MD and a check-bit storing part MC.

The memory storage unit B also includes a read-data correcting circuit DC for correcting data read from the main memory M. The memory storage unit B also includes a write-data selecting circuit WS which receives data transferred through a line $l_1$ from the data processing unit A and data transferred through a line $l_9$ from the read-data correcting circuit DC, and selects data to be written into the main memory M and the alternate memory MA by selecting one of these lines $l_1$ and $l_9$ as the input for the write-data selecting circuit WS. The output line $l_2$ of the write-data selecting circuit WS is connected to the input of the data-bit storing part MD, to an input of a check-bit generating circuit CG, and to a first input of a multiplexer MPX. The second input of the multiplexer MPX is connected through a line $l_3$ to the output of the check-bit generating circuit CG. The check-bit generating circuit CG generates check bits used to correct error data in the data bits by using data transferred through the line $l_2$ from the write-data selecting circuit WS. The generated check bits are written in the check-bit storing part MC, as well as transferred through a line $l_3$ to the multiplexer MPX. The multiplexer MPX selects data to be written into the alternate memory MA by selecting one of these lines $l_2$ and $l_3$ as the input of the multiplexer MPX.

When the alternate memory is not used, the data stored in the data-bit storing part MD and the check bits stored in the check-bit storing part MC are read out, transferred through lines $l_4$ and $l_5$, respectively, pass through a read-data selecting circuit RS, then through a line $l_6$ to the read-data correcting circuit DC and then to a syndrome generating circuit SG. The syndrome generating circuit SG generates a syndrome pattern, and if one bit error is detected in the read-data by using the syndrome pattern, an error syndrome signal is generated and transferred through a line $l_7$ to a first decoder DEC①. The decoder DEC① determines the position of the error bit and transfers a signal indicating the position of the error bit to the read-data correcting circuit DC through a line $l_8$. The read-data correcting circuit DC corrects the read data by using the signal from the first decoder DEC①. The corrected data is then transferred through the line $l_9$ to the data processing unit A. The error syndrome output from the syndrome generating circuit SG is also transferred through the line $l_7$ to a syndrome memory circuit SM. The syndrome memory circuit SM stores the error syndrome and includes a comparator (not shown) in FIG. 1) for comparing the stored error syndrome and an error syndrome generated in the next read-out operation. When both error syndromes coincide, the error syndromes are stored as an alternate syndrome in the syndrome memory circuit SM. The alternate syndrome is transferred through a line $l_{16}$ to a second decoder DEC②, in which the position of the bit to be alternated is determined. The second decoder DEC② then generates a signal indicating the position of the bits to be alternated.

The signal from the second decoder DEC② is transferred through a line $l_{17}$ to a third input of the multiplexer MPX and to a third input of the read-out data selecting circuit RS. The multiplexer MPX selects one of the two lines $l_2$ and $l_3$ as its input by referring to the data transferred through the line $l_{17}$. The data selected by the multiplexer MPX is used as data to be written in the alternate memory MA. The output of the alternate memory MA is connected through a line $l_{15}$ to a fourth input of the read-data selecting circuit RS. The read-data selecting circuit RS determines which one of the two lines $l_4$ and $l_5$ is to be alternated with the line $l_{15}$, by referring to the data transferred through the line $l_{17}$.

The memory storage unit B also includes an error processing unit EP for processing an error and for controlling the alternate memory MA and alternating it with the main memory if necessary.

The error processing unit EP usually patrols or scans the main memory in accordance with a predetermined regular routine. However, in accordance with this embodiment of the present invention, the error processing unit EP may begin to patrol the main memory at any time when an error is detected in the read data by the syndrome generating circuit during the time the data processing unit A occupies or accesses the main memory. During the time the error processing unit EP patrols or scans the main memory M, the error processing unit EP generates an inhibit signal which is transferred through a line $l_{25}$ to the data processing unit A, so that the data processing unit A is inhibited from accessing the main memory M.

When an error is detected by the syndrome generating circuit SG, the error syndrome is stored into the syndrome memory circuit SM and an error information signal is transferred through a line $l_{20}$ to the error processing unit EP. The error processing unit EP then analyzes the error information signal. As a result of the analysis, if the error is recognized as a correctable error, the error processing unit EP generates a write-data select control signal which is transferred through a line $l_{24}$ to the control input of the write-data selecting circuit WS. In response to the write-data select control signal, the write-data selecting circuit WS selects the line $l_9$ as its input. At the same time, the error processing unit EP generates an address signal which is the same as the address of the error bit. The address signal is transferred through a line $l_{18}$, to the address selecting circuit AS and then through a line $l_{12}$ to the main memory M. Then, the correct data corrected by the read-data correcting circuit DC is written in the same address of the main memory M where the error occured, by the use of the address signal.

Then, the error processing unit patrols or scans the main memory M. As a result of the patrol, if an error is detected again by the syndrome generating circuit SG, the error information signal is again transferred to the error processing unit EP and, in the syndrome memory SM, the error syndrome is compared with the previously stored error syndrome.

If the error syndrome coincides with the previously stored error syndrome, a coincidence signal is transferred through a line $l_{21}$ to the error processing unit EP. The error processing unit EP then analyzes the signals from the lines $l_{20}$ and $l_{21}$. As a result of the analysis, the error is recognized as a hard error. Then the read data is again corrected by the data correcting circuit DC. The corrected data is then transferred through the write-data selecting circuit WS, the line $l_2$, the multiplexer MPX and the line l₁₄ to the alternate memory MA, and is written therein. If the error data is check-bit data, the corrected data is transferred through the check bit generating circuit CG, the line l₃, the multiplexer MPX and the line l₁₄ to the alternate memory MA. After this, the data stored in the alternate memory MA is used instead of using the incorrect data stored in the main memory M.

If the error syndrome does not coincide with the previously stored error syndrome, the previous error is recognized as a soft error.

Figure 2A:
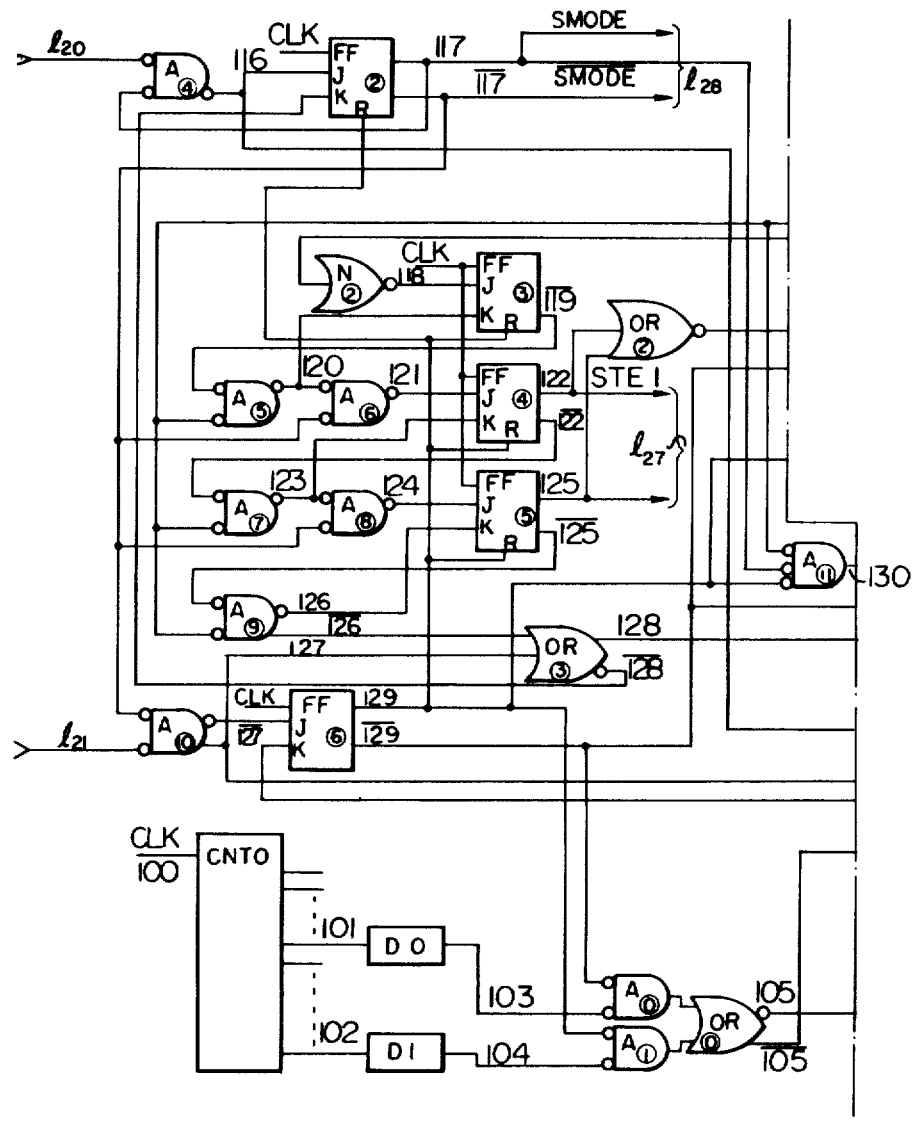
FIG. 2, including 2A and 2B is circuit diagram illustrating an error processing unit EP included in the system of FIG. 1.
Figure 2B:
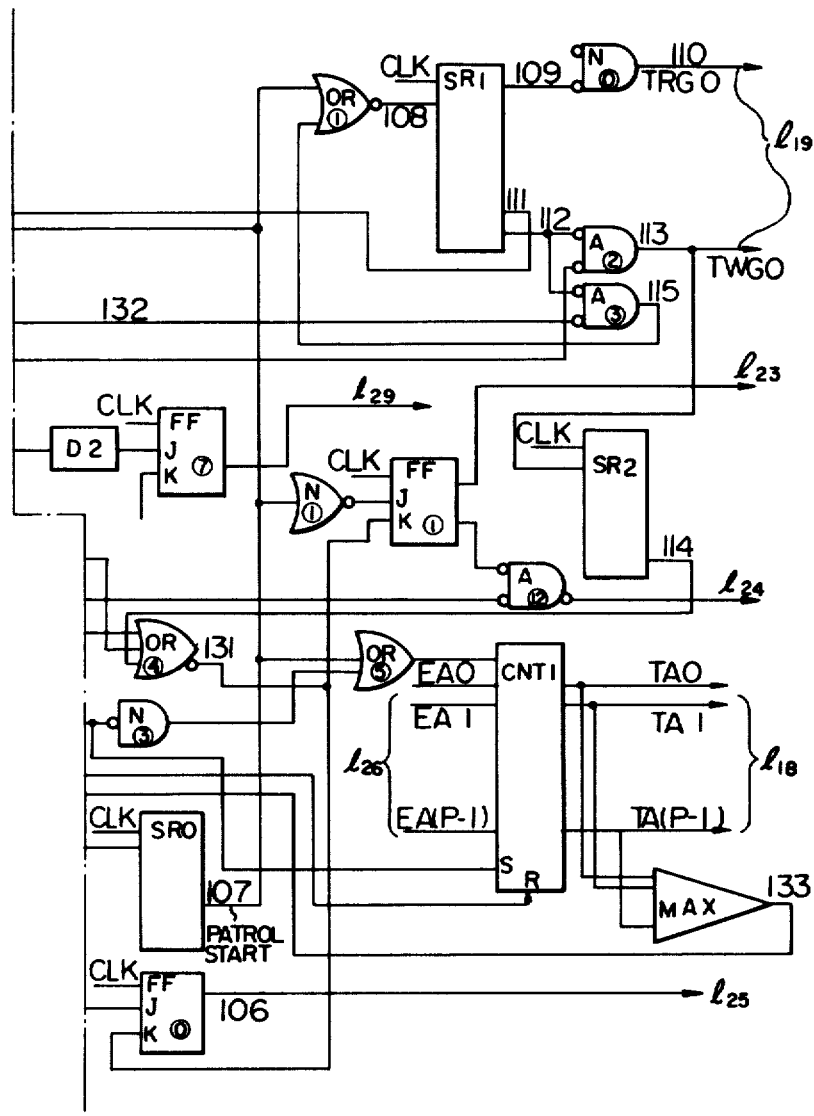

FIG. 2 is a detailed logic circuit diagram of the error processing unit EP in FIG. 1. In FIG. 2, the error processing unit comprises counters CNT0 and CNT1, AND gates A⓪ through A⑫, OR gates OR⓪ through OR⑤, inverters N⓪ through N③, J-K flip-flop FF⓪ through FF⑦, differential circuits D0 through D2, a maximum address counting circuit MAX, and shift registers SR0 through SR2. It should be noted that this and other following circuits are operated by the well-known CML (Current-Mode Logic) technique. Therefore, each AND gate outputs a logic "L" (Low) when both inputs receive a logic "L". Also, each OR gate outputs a logic "H" (High) when at least one of its inputs receives a logic "H". Also, each J-K flip-flop is set to output a logic "H" when its J-input receives a logic "L" and is reset when its K-input receives a logic "L".

Figure 3:
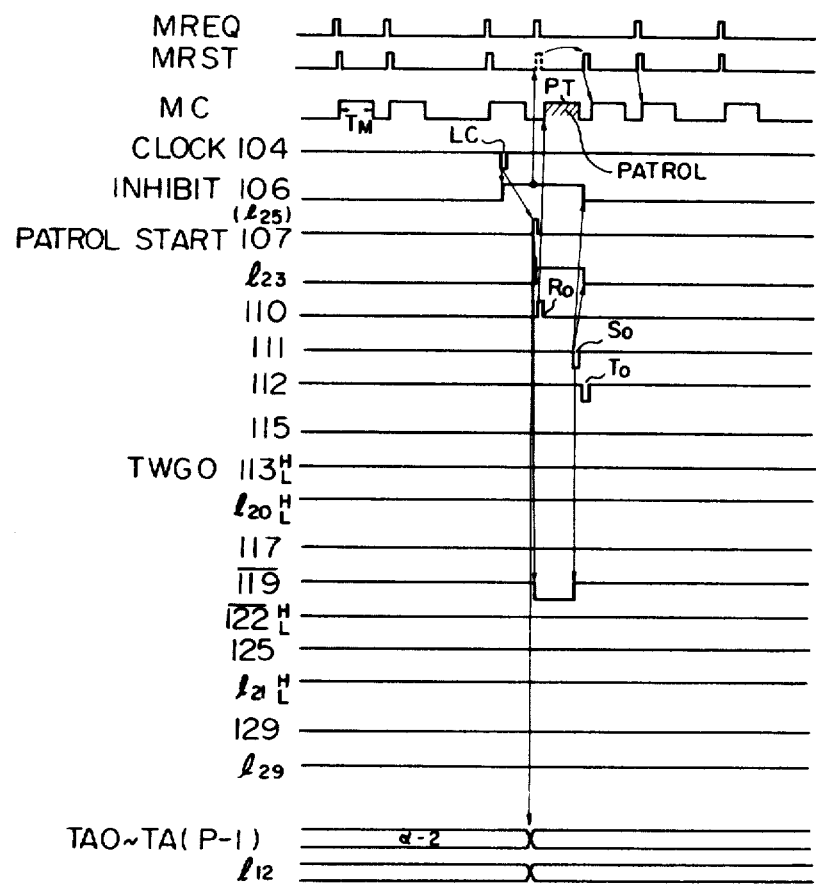
FIG. 3 depicts a time chart used for explaining the operation of the error processing unit of FIG. 2 when no error is detected by the syndrome generating circuit SG included in the system of FIG. 1.

FIG. 3 is a time chart used for explaining the operation of the error processing unit of FIG. 2 when no error is transferred from the syndrome generating circuit SG through the line l₂₀. Referring to FIGS. 1, 2 and 3, the operation of the data processing system will now be explained in detail.

The counter CNT0 generates two types of clock signals HC and LC on lines 103 and 104 periodically. The frequency of the clock signal HC on the line 103 is higher than the clock signal LC on the line 104. When the error processing unit EP operates in a regular routine, the patrol operation is started by the clock signal LC on the line 104. When an alternate operation is excuted, the patrol operation is started by the high frequency clock signal HC on the line 103. In the regular routine, when the error coincidence signal on the line l₂₁ is a logic "H", that is, no error is detected, as illustrated in FIG. 3, the flip-flop FF⑥ is reset and its ouput line 129 becomes a logic "L". Therefore, the clock signal LC on the line 104 is transferred through the AND gate A① and the OR gate OR⓪ to the J-input of the flip-flop flip-flop FF⓪, to set the FF 0 so that its output line 106 becomes a logic "H". The output line 106 of the flip-flop FF⓪ is connected to the line l₂₅. The logic "H" of the line l₂₅ inhibits the data processing unit A (FIG. 1) from accessing the main memory M. In the data processing unit A, memory request signals MREQ are generated as illustrated in FIG. 3. The memory request signal MREQ is usually output from the data processing unit A as memory start signals MRST. By the rising edge of each memory start signal MRST, a memory clock signal MC having a time duration T_M of a memory cycle is generated. However, when the memory start signal MRST is inhibited from being output, the corresponding memory clock signal is not generated, and in this case, a patrol clock signal PT is generated as follows.

The inverted clock signal at the inverse output line $\overline{105}$ is applied to the shift register SR0. In the shift register SR0, the inverted clock signal on the line $\overline{105}$ is delayed by a predetermined time of about one memory cycle. This delay is necessary for the inverted clock signal on the line $\overline{105}$ to be used as a patrol start signal on a line 107, after the end of the memory cycle. The clock signal on the line $\overline{105}$ is delayed and is transferred through the OR gate OR① to the shift register SR1 to be used as the patrol start signal. The shift register SR1 generates a signal on a line 109 which is then inverted by the inverter N⓪ to form a first read-operation start signal R₀ on output line 110. The signal R₀ is transferred through the line l₁₉ (FIG. 1) to the start signal selecting circuit SS.

The patrol start signal on the line 107 is also transferred through the inverter N① to the flip-flop FF① to set the flip-flop FF①. The output signal of the flip-flop FF① is transferred through the line l₂₃ (FIG. 1) to the address signal selecting circuit AS and the start signal selecting circuit SS.

The patrol start signal on the line 107 is also transferred through the OR gate OR⑤ to the counter CNT1. The counter CNT1 then generates address signals TA0 through TA(P-1) which are transferred through the line l₁₈ to the address signal selecting circuit AS (FIG. 1). The circuit SS then selects the signal R₀, and the circuit AS selects the signals TA0 through TA(P-1). Then, the first reading operation is executed with respect to the address in the main memory specified by the address signals A₀ through A(P-1) output by the addressing select circuit AS over line l₁₂.

In the first reading operation, when a one bit error is not detected, the level of the line l₂₀ is a logic "H", so that the search mode flip-flop FF② is not set. In this condition, the shift register SR1 generates a second signal S₀ on the line 111 at a predetermined time after generating the first read-operation start signal R₀. Also, the shift register SR1 generates a third signal T₀ on the line 112 at a predetermined time after generating the second signal S₀ on the line 111 as illustrated in FIG. 3. Since the search mode flip-flop FF② is not set, the inverted output signal on the line $\overline{117}$ is a logic "H". Therefore, the second signal S₀ on the line 111 cannot be transferred through the AND gates A⑤ and, thus, the output signal on a line 121 is a logic "H". Accordingly, the flip-flop FF④ is not set. The signal on the output of the flip-flop FF④, which is thus a logic "L", is not transferred through the OR gate OR②. Therefore, the output signal on line 132 of the OR gate OR② is a logic "H". Consequently, the signal on the line 112 is prevented from being transferred through the AND gate A③. Thus, a restart signal on the line 115 is not generated.

Since the search mode flip-flop FF② is not set, output line 117 is at a logic "L". Also, since the flip-flop FF⑥ is not set, output 129 is at a logic "L". Therefore, when the second signal S₀ on the line 111 is generated, all three inputs of the AND gates A⑪ become logic "L". Then, a reset signal on line 130 is generated and transferred through the OR gate OR④ to be applied to the K-inputs of the flip-flops FF⓪ and FF①. Thus, the flip-flops FF⓪ and FF① are reset, and the patrol operation is completed.

Figure 4:
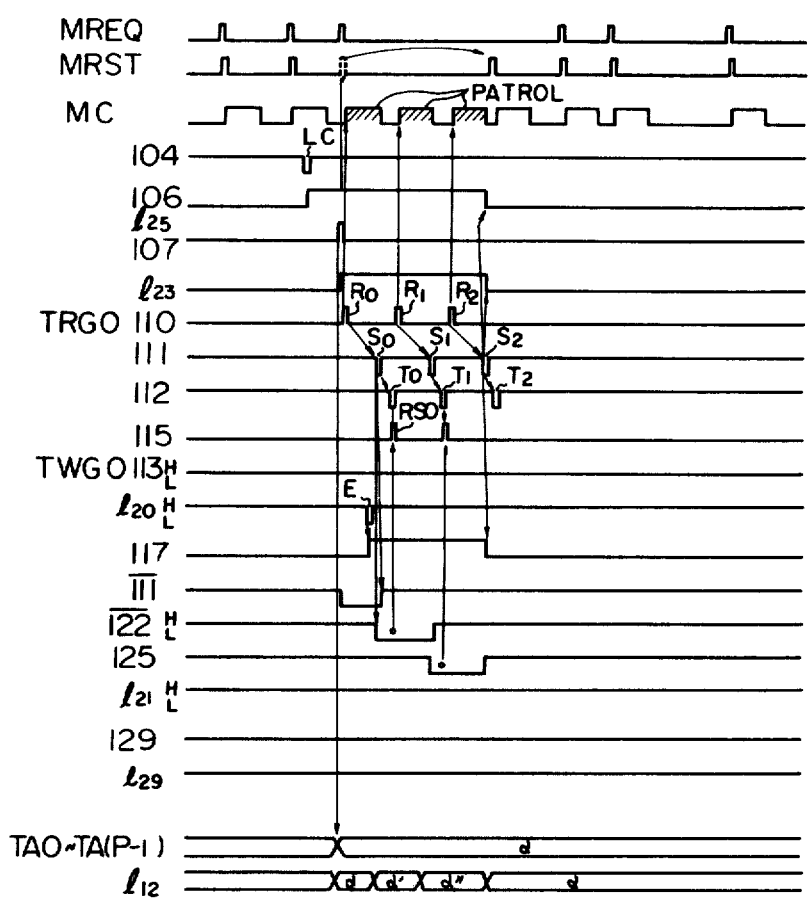
FIG. 4 depicts a time chart used for explaining the operation of the error processing unit of FIG. 2 when one bit error is detected in the first reading operation, but in the second and third reading operations the same bit error is not detected.

FIG. 4 is a time chart used for explaining the operation of the error processing unit of FIG. 2 when a one bit error is detected in the first reading operation, but in the second and third reading operations the same one bit error is not detected. In this case, the error information signal E is generated during the first reading operation and is transferred from the syndrome generating circuit SG (FIG. 1) through the line $l_{20}$ to the AND gate A ④ in the error processing unit EP. Then, the logic "L" on the line 116 is applied to the J-input of the search made FF ② to set the flip-flop FF ②. Therefore, the inverted output signal on the line $\overline{117}$ becomes a logic "L". When the second signal $S_0$ on the line 111 is generated by the shift register SR1, both inputs of the AND gate A ⑥ become a logic "L". Thus, the flip-flop FF ④ is set to output a status signal STE1, which is transferred through a line $l_{27}$ (FIG. 1) to the address selecting circuit AS. The states signal STE1 on the line 122 is also transferred through the OR gate OR ② to the one input of the AND gate A ③. In this condition, when the third signal $T_0$ on the line 112 is generated, the third signal $T_0$ can be transferred through the AND gate A ③. Thus, a restart signal $RS_0$ on the line 115 is obtained at the output of the AND gate A ③. The restart signal $RS_0$ on the line 115 is transferred through the OR gate OR ① to the shift register SR1. Then, the second read-operation start signal $R_1$ is immediately generated on line 110.

The address in this second read operation is controlled so that it differs from the address in the first read operation by the use of the signal STE1 on the line 122. That is, when the address selecting circuit AS (FIG. 1) receives the signal STE1, a part of the address data is inverted to form another address for accessing the main memory.

In the second read operation, if a one bit error is not detected, or if a one bit error is detected but the error bit is not the same as the error bit detected in the first read operation, the second signal $S_1$ generated on the line 111 by the shift-register SR1, after the generation of the second read start signal $R_1$ on the line 110, is transferred through the AND gates A ⑦ and A ⑧ to the flip-flop FF ⑤, so that the flip-flop FF ⑤ is set to output a status signal STE2. The status signal STE2 is transferred through the line $l_{27}$ to the address selecting circuit AS. The output signal on the output line 122 of the FF ④ is also transferred through the OR ② to one input of the flip-flop AND gate A ③ over line 132. Therefore, when the third signal $T_1$ on the line 112 is generated after the generation of the second signal $S_1$ on the line 111, the third signal $T_1$ can pass through the AND gate A ③ and its output signal is used as a third time start signal and applied through the OR ① to the shift register SR1. Then, a third time read start signal $R_2$ is generated immediately, as illustrated in FIG. 4, and the signal $R_2$ is transferred through the line $l_{19}$ to the circuit SS. Then, the third time reading operation is executed in the same way as the previous reading operations.

In the third time reading operation, if a one bit error is not detected or if the one bit error does not coincide with the previously stored one bit error, the second signal $S_2$ on the line 111 is transferred through the AND gate A ⑨ to the flip-flop FF ⑤ so that the flip-flop FF ⑤ is reset. At the same time, the inverted output signal on the line $\overline{126}$ of the AND gate A ⑨ is applied through the OR gates OR ③ and OR ④ to the flip-flops FF ⓪ and FF ①, so that these flip-flops are reset. Also, the flip-flop FF ② is reset by receiving at its k-input the signal on the line $\overline{126}$ transferred from the AND gate A ⑨ through the OR gate OR ③. Thus the patrol operation for this third time address is completed.

Figure 5:
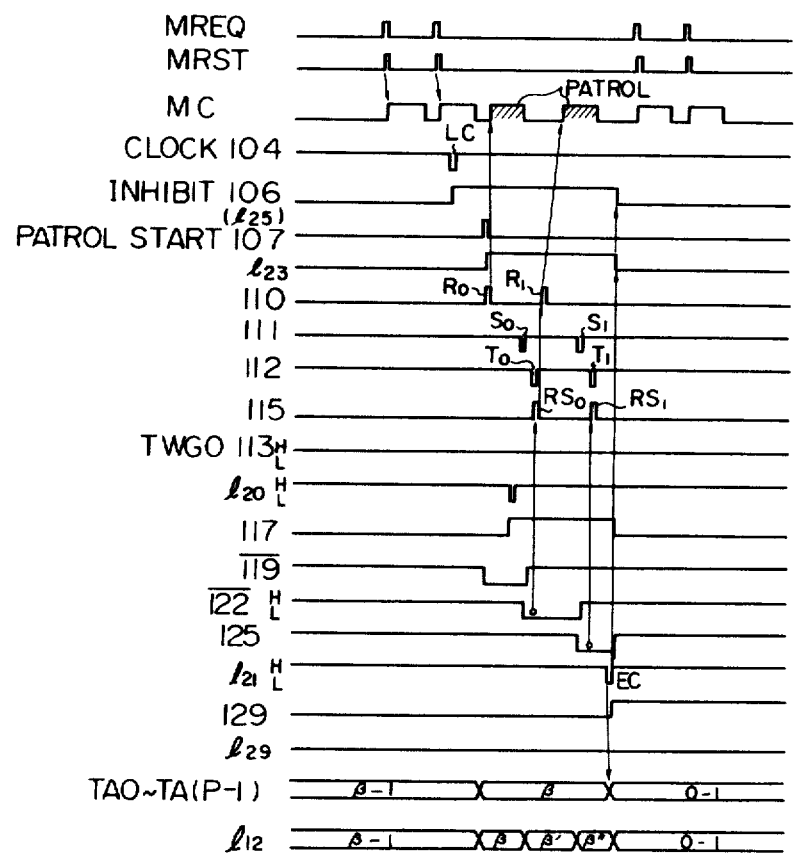
FIG. 5 depicts a time chart illustrating when one bit error is detected in the first reading operation and when the bit error in the second reading operation coincides with the bit error in the first reading operation.

FIG. 5 is a time chart illustrating when a one bit error is detected in the first reading operation and when the error bit in the second reading operation coincides with the error bit in the first reading operation. In this case, the error coincidence signal EC is transferred from the syndrome memory circuit SM through the line $l_{21}$ to one input of the AND gate A ⑩. Since the search mode flip-flop FF ② is in a set state at this moment, another input of the AND gate A ⑩ is a logic "L". Therefore, the alternate mode flip-flop FF ⑥ is set so that its output signal on the line 129 is set to a logic "H". The output signal on the line 129 causes the flip-flops FF ②, FF ③, FF ④ and FF ⑤, for the patrol operation, to be reset.

Also, a logic "H" on the line $\overline{127}$ from the inverted output of the AND gate A ⑩ is conducted through the OR gates OR ③, OR ④ and OR ⑤ to the counter CNT1, to reset the counter to zero. In addition, the signal on the line $\overline{127}$ is transferred to the k-inputs of the flip-flops FF ⓪ and FF ① so that the flip-flops FFs 0 and 1 are both reset. Then, the alternate operation is executed.

Figure 6:
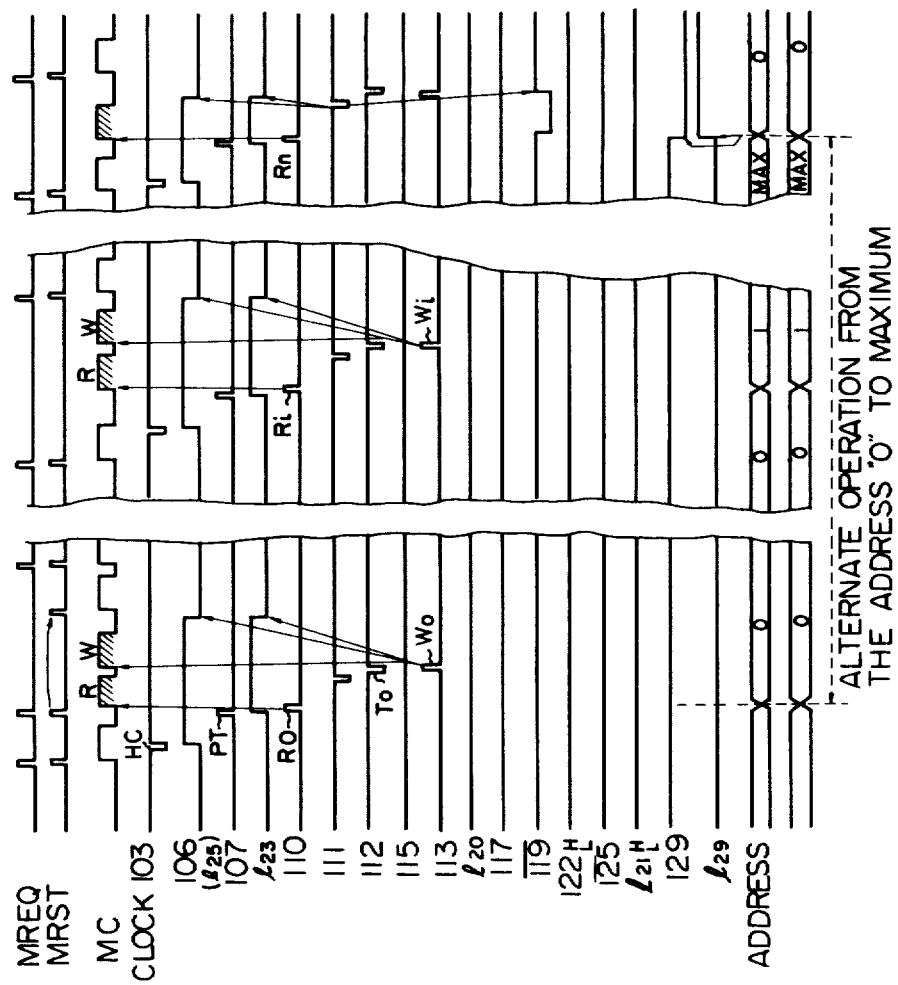
FIG. 6 depicts a time chart used for explaining the alternate operation executed by the error processing unit EP of FIG. 2.

FIG. 6 is a time chart used for explaining the alternate operation. Since the alternate mode flip-flop FF ⑥ is set at the beginning of the alternate operation, a logic "H" on the line 129 from the output of the alternate mode flip-flop FF ⑥ is applied to one input of the AND gate used to stop A 1 the patrol start signal on the line 104 from being conducted through the AND gate A ①. Also, a logic "L" on the line $\overline{129}$ is applied to one input of the AND gate A ⓪, so that the high frequency clock signal HC on the line 103 is conducted through the AND gate A ⓪. Thus, the high frequency clock signal on the line 103 is used as the patrol start signal in the alternate operation. Since the clock signal 103 has a high frequency, as previously mentioned, the alternate operation is performed rapidly. In the alternate operation, the first read operation for the address "0" is executed in the same way as in the regular routine, except that, instead of the low frequency clock signal on the line 104, the high frequency clock signal on the line 103 is used in this alternate operation.

At a predetermined time after the read start signal $R_0$ is generated, the third signal $T_0$ on the line 112 is applied to one input of the AND gate A ②. Since another input of the AND gate A ② is at a logic "L" level because the alternate-mode flip-flop FF ⑥ is in a set state, the third signal $T_0$ on the line 112 is transferred as a write start signal $W_0$ through the AND gate A ②, the line 113 and the line $l_{19}$ to the start signal selecting circuit SS (FIG. 1). The data read from the main memory M is corrected by the data correcting circuit DC (FIG. 1). The corrected data is then selected by the write selecting circuit WS under the control of the signal on the line $l_{24}$. The signal on the line $l_{24}$, which is connected to the output of the AND gate A ⑫, is a logic "L" as long as the flip-flops FF ① and FF ⑥ are in a set state, because the inverted outputs of the flip-flops FF ① and FF ⑥ are connected to both inputs of the AND gate A ⑫. The corrected data selected by the write selecting circuit WS is then written into the main memory M and the alternate memory MA under the control of the write start signal $W_0$.

The patrol start signal PT on the line 107 also causes the flip-flop FF ① to be set, and the control signal is obtained on the line $l_{23}$. The control signal on the line $l_{23}$ controls the address selecting circuit AS and the start signal selecting circuit SS, as previously explained.

When the write signal $W_0$ is generated on the line 113, the signal on the line 113 is also applied to the shift register SR2. In the shift register SR2, the write start signal $W_0$ is delayed for a predetermined time and a reset signal is obtained at the output line 114 of the shift register SR2. The reset signal on the line 114 is applied through the OR gate OR④ to the k-inputs of the flip-flops FF⓪ and FF①. Thus, these flip-flops are reset and the alternate operation for the address "0" is completed.

Then, alternate operations for addresses "1", "2", ... followed by the address "0" are executed, as illustrated in the middle portion of the time chart of FIG. 6. These alternate operations are executed in the same way as the alternate operation for the address "0" described above. The maximum address counting circuit MAX counts the number of addresses accessed in the alternate operation. After completion of the last alternate operation, which corresponds to the maximum address, the maximum address counting circuit MAX generates a signal on the line 133. The signal on the line 133 resets the alternate-mode flip-flop FF⑥. Thus, all of the alternate operations are completed.

Error processing when the data processing unit A is accessing the main memory M will now be described. During the time the data processing unit A accesses the main memory M, if a one bit error occurs, the error information signal is transferred through the line $l_{20}$ to the search mode flip-flop FF②, so that the flip-flop FF② is set. At the same time, the error address is stored in the address selecting circuit AS. The address data stored in the address selecting circuit AS is transferred through a line $l_{26}$ to the counter CNT1 in the error processing unit EP, so that the counter CNT1 is preset. After presetting the counter CNT1, when a clock signal on the line 104 is generated, the error processing unit EP begins to execute the patrol operation.

FIGS. 7 through 13 are logic circuit diagrams of the data correcting circuit DC, the syndrome memory SM, the write data selecting circuit WS, the read data selecting circuit RS, the multiplexer MPX, the address selecting circuit AS and the start signal selecting circuit SS, respectively, all appearing in FIG. 1. The functions of these circuits DC, SM, WS, RS, MPX, AS and SS have already been described. Therefore, only a brief explanation with respect to these circuits will be hereinafter presented.

Figure 7:
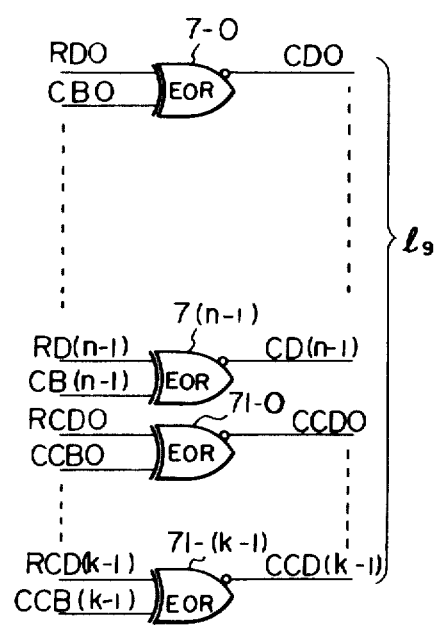

In FIG. 7, the data correcting circuit comprises a plurality of exclusive OR circuits EOR7-0 through EOR7-(n-1) and EOR71-0 through EOR71-(k-1). Each of the exclusive OR circuits EORs7-0 through 7-(n-1) receives at one of its inputs read data RD0, ..., or RD(n-1) transferred from the read data selecting circuit RS through the line $l_6$. Another input of each exclusive OR circuit EOR7-0, ..., or EOR7-(n-1) receives a signal, indicating the position of the error data bit to be corrected, transferred from the decoder DEC① through the line $l_8$. Also, each of the exclusive OR circuits EOR71-0 through 71-(k-1) receives at one of its inputs read check bit data transferred through the line $l_6$, and at another input a signal, indicating the position of the check bit to be corrected, transferred through the line $l_8$. The exclusive OR circuits EOR7-0 through 7-(n-1) and 71-0 through 71-(k-1) output corrected data CD0 through CD(n-1) and corrected check-bit data CCD0 through CCD(k-1), respectively.

Figure 8:
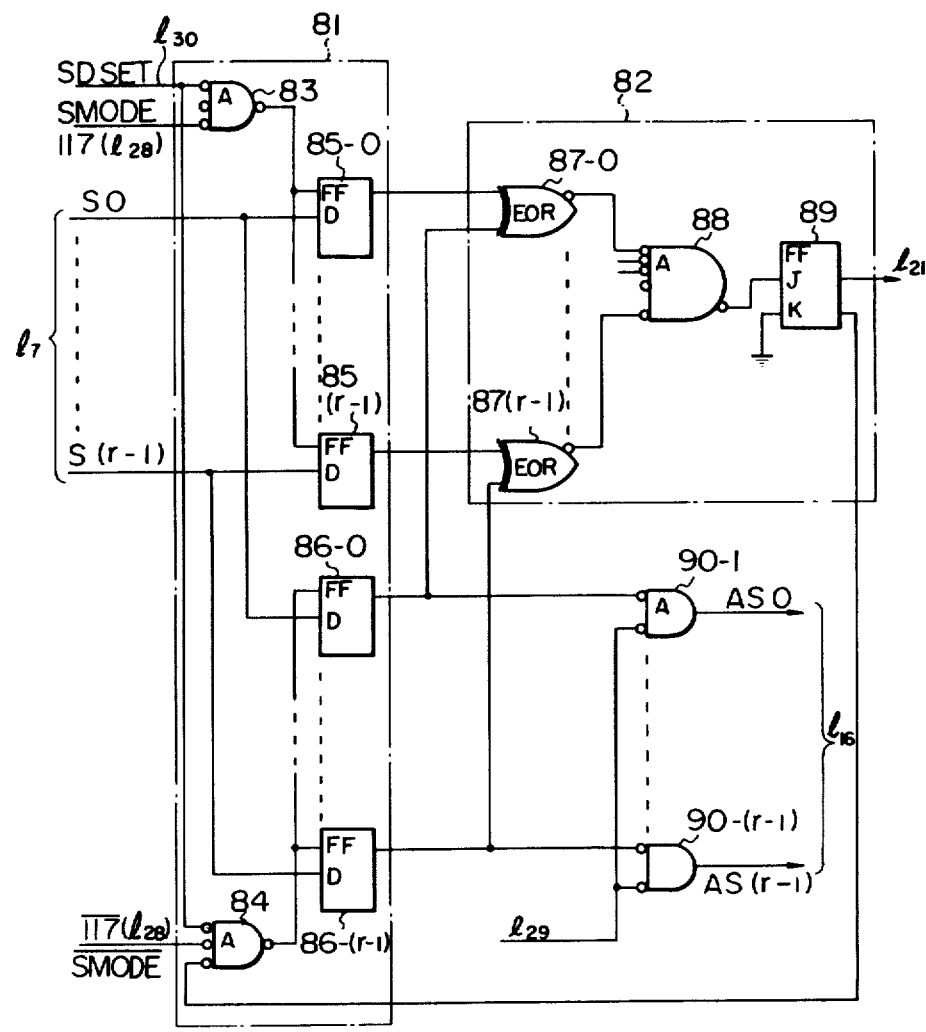

In FIG. 8, the syndrome memory circuit SM comprises a memory 81 and a comparator 82. The memory 81 includes two AND gates 83 and 84, a first group of a plurality of D-type flip-flops FF 85-0 through FF 85-(r-1), and a second group of a plurality of D-type flip-flops FF 86-0 through 86-(r-1). Those flip-flops receive at their D-type inputs the data $S_0$ through $S(r-1)$ of the syndrome pattern transferred from the syndrome generating circuit SG through the line $l_7$. The comparator 82 includes a plurality of exclusive OR circuits EOR87-0 through 87-(r-1), one input of each exclusive OR circuits EOR being connected to an output of one of the D-type flip-flops in the first group and another input of each exclusive OR circuit EOR being connected to an output of one of the D-type flip-flops in the second group. The clock inputs of the first flip-flop group are commonly connected to the output of the AND gate 83. The clock inputs of the second flip-flop group are commonly connected to the output of the AND gate 84. The AND gate 83 receives a syndrome set signal SDSET on a line $l_{30}$. The signal SDSET is generated by the read timing generator TGR in the start signal selecting circuit SS after the signals $\overline{CMRG0}$ or $\overline{TRG0}$ are received. The other input SMODE of the AND gate 83 is the output of the search mode flip-flop FF② (FIG. 2A). The SMODE is at logic "L" when it is not the search mode. The signal SDSET sets the syndrome pattern into the first group of memories. The output of each of the second group flip-flops FF 86-0, ... and 86-(r-1) is connected to one of the inputs of a respective AND gate 90-1, ... and 90-(r-1), another input of each gate is connected to the line $l_{29}$. The first input of the AND gate 84 is connected to the line $l_{30}$ to receive the syndrome set signal SDSET, and the second input is connected to the line $l_{28}$.

In the first reading operation, the first syndrome pattern S0 through S(r-1) is stored in the first group of the flip-flops FF 85-0 through 85-(r-1). In the second reading operation, if the search mode signal $\overline{SMODE}$ is applied through the line $l_{28}$ to the AND gate 84, the second syndrome pattern is stored in the second group of the flip-flops FF 86-0 through 86-(r-1). The first syndrome pattern and the second syndrome pattern are then compared in the comparator 82. If the first syndrome pattern coincides with the second syndrome pattern, the coincidence signal is generated on the line $l_{21}$. Then, the alternate mode flip-flop FF⑥ (FIG. 2) and the flip-flop FF⑦ are set to generate a signal on the line $l_{29}$. Thus, the AND gates 90-1 through 90-(r-1) generate the signals $AS_0$ through $AS(r-1)$ which are transferred through the line $l_{16}$ to the decoder DEC② (FIG. 1).

Figure 9:
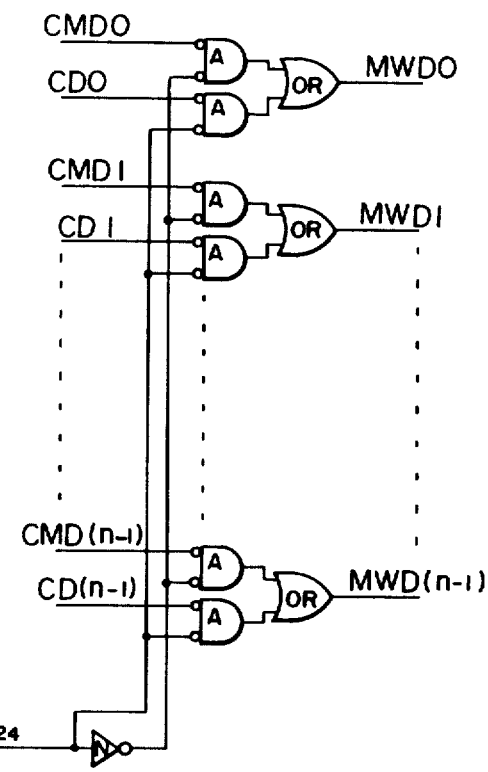

In FIG. 9, the notations CMD0 through CMD(n-1), which are input signals, represent the data transferred from the data processing unit A through the line $l_1$, and the notations CD0 through CD(n-1), which are input signals, represent the corrected data transferred from the data correcting circuit DC through the line $l_9$, and the notations MWD0 through MWD(n-1), which are output signals, represent the data selected by this write-data selecting circuit WS.

Figure 10:
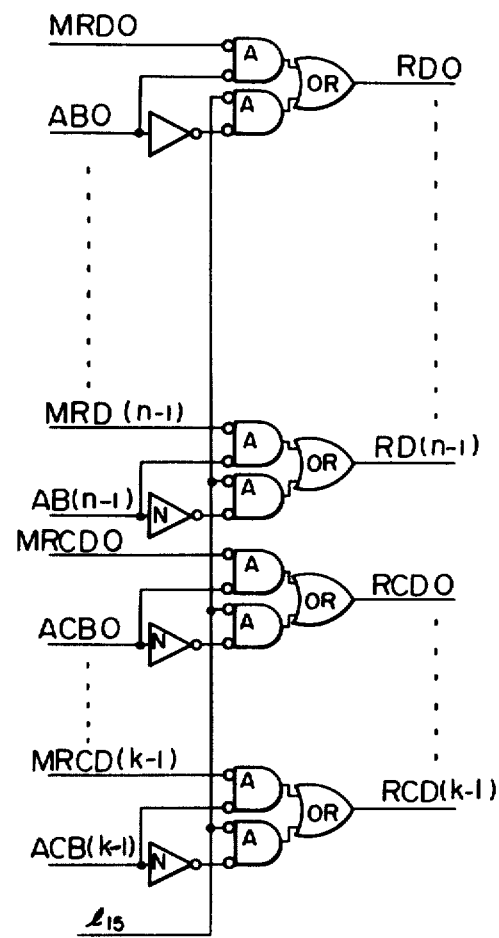

In the input signals in the read data selecting circuit RS of FIG. 10, the notations MRD0 through MRD(n-1) represent the data read from the data-bit storing part MD of the main memory M and transferred through the line $l_4$. The notations MRCD0 through MRCD(k-1) represent the data read from the check-bit storing part MC of the main memory M and transferred through the line $l_5$. The notations AB0 through AB(n-1) and ACB0 through ACB(k-1) represent the data transferred from the decoder DEC② through the line $l_{17}$ which indicates the revised the position of the data bits and check-bits, respectively, that are to be alternated. The output signals RD0 through RD(n-1) represent the read data selected by this read data selecting circuit RS, and the output signals RCD0 through RCD(n-1) represent the read check-bit data selected by this circuit RS.

Figure 11:
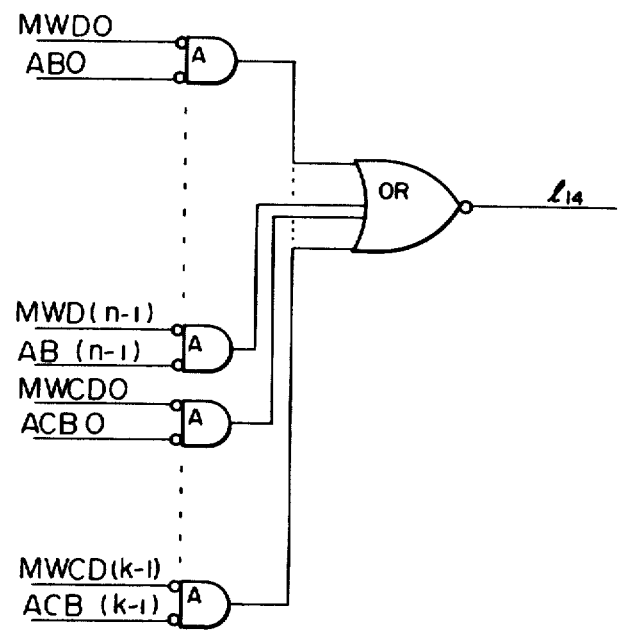

In FIG. 11, the input singals MWD0 through MWD(n-1) are the same as the output signals of the circuit WS in FIG. 9. Also, the input signals MWCD0 through MWCD(k-1) represent the check-bit data transferred from the check bit generation circuit CG through the line $l_3$. The input signals AB0 through AB(n-1) are the signals transferred from the decoder DEC② through the line $l_{17}$. The input signals ACB0 through ACB(k-1) are also the signals transferred from the decoder DEC② for indicating the positions of the check bits to be alternated.

In FIG. 12, the input signals CMA0 through CMA(p-1) represent address data transferred from the data processing unit A through the line $l_{10}$. The input signals TA0 through TA(p-1) represent address data transferred from the error processing unit EP through the line $l_{18}$. The address selecting circuit AS includes AND-OR circuits, address registers AR and error address registers ER. The output signals MA0 through MA(p-1) are address data selected by the address selecting circuit AS. The output signals EA0 through EA(p-1) are error address signals to be applied to the counter CNT1 in the error processing circuit EP.

In FIG. 13, the input signal CMRGO is a read start signal transferred from the data processing unit A through the line $l_{11}$. The input signal TRGO is a read start signal transferred from the NAND gate N⓪ in the error processing unit EP through the line $l_{19}$. The input signal CMWGO is a write start signal transferred from the data processing unit A through the line $l_{11}$. The input signal TWGO is a write start signal transferred from the AND gate A② in the error processing unit EP through the line $l_{19}$. The output signal CE is a chip enable signal and the output signal WE is a write enable signal, which signals are referred to as the memory clock signal MC in FIGS. 3 through 6. The output signal SDSET is a syndrome set signal, which signal is sent to the syndrome memory circuit SM. TGR is a read timing generator circuit and TGW is a write timing generator. These timing generator circuits comprise, for example, delay line circuits and AND gates.

In the above described first embodiment, although the error processing unit EP is included in the memory storage unit B, alternatively, according to the present invention, it may be included in the data processing unit A, or it may be independent from the data processing unit A and the memory storage B, without departing from the essence of the present invention. Also, the error processing unit EP may comprise a microcomputer or its function may be realized by a microprogram.

Figure 14:
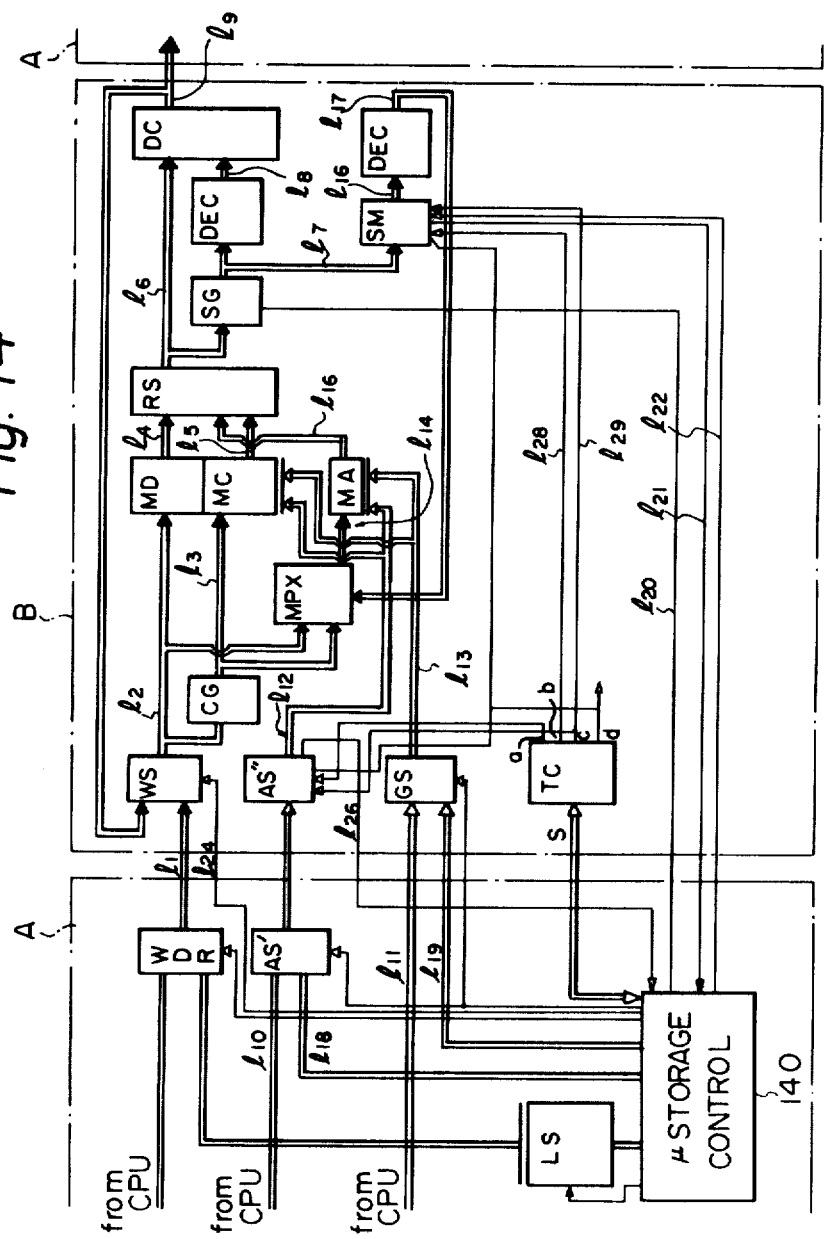
FIG. 14 is a block diagram illustrating a data processing system according to another embodiment of the present invention.

FIG. 14 is a block diagram illustrating a data processing system according to another embodiment of the present invention. The data processing system of FIG. 14 has almost the same circuit blocks as the data processing system of FIG. 1, except that in the system of FIG. 14, instead of the error processing unit EP in FIG. 1, a microprogram storage and control unit 140 is included in the data processing unit A. The data processing unit A in FIG. 14 also includes a local storage LS, a write-data register WDR connected to the local storage LS, and a first address selecting circuit AS' connected to the microprogram storage and control unit 140. The first address selecting circuit AS' comprising the AND-OR circuits in the address selecting circuit AS of FIG. 12. A further difference between the data processing systems of FIG. 1 and FIG. 14 is that the memory storage unit B of FIG. 14 includes a second address selecting circuit AS" comprising the address registers AR and the error address registers ER in the address selecting circuit AS of FIG. 12. A still further difference between the systems of FIG. 1 and FIG. 14 is that the memory storage unit B in FIG. 14 includes an alternate operation control circuit TC. The alternate operation control circuit TC has a part of the functions of the error processing unit EP of FIG. 2. The circuit TC and its interface are illustrated in detail in FIG. 15.

Figure 15:
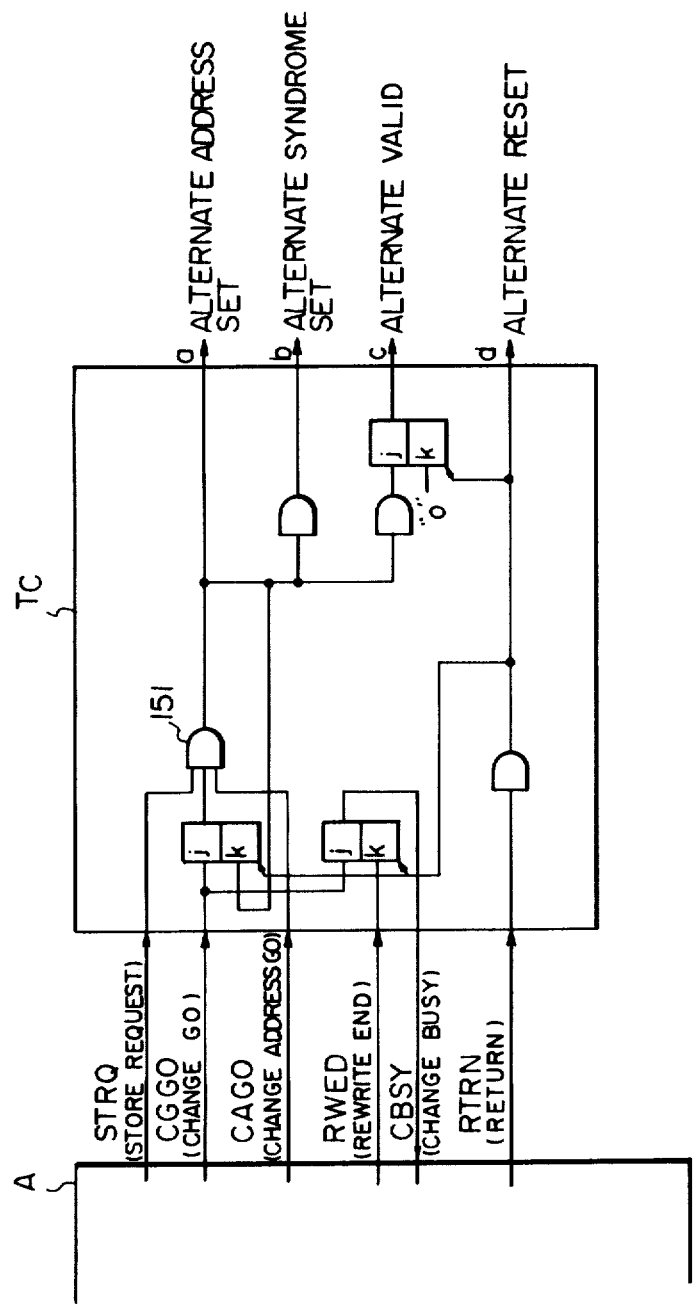
FIG. 15 is a circuit diagram illustrating the alternate operation control circuit TC included in the system of FIG. 14.

In FIG. 15, the alternate operation control circuit TC receives signals STRQ, CGGO, CAGO, RWED, CBSY, and RTRN from the data processing unit A. The signal STRQ is the signal used for requesting alternate control. The signal CGGO is the start signal of the alternate operation control. The signal CAGO is the control signal used for setting the alternate address and the alternate syndrome. The signal RWED is the signal used for indicating the end of the alternate operation. The signal CBSY is the signal indicating that the alternate operation is being executed. The signal RTRN is the signal used for resetting the alternate operation control. The alternate operation control circuit TC outputs four signals a, b, c and d. The signal a is a signal used for setting the address to be alternated. The signal b is a signal used for setting the syndrome to be alternated. The signal c is a signal used for indicating that the alternate is valid. The signal d is a signal used for resetting the alternate operation. The operation of the alternate operation control circuit TC will be obvious to those skilled in the art and, therefore, is not described here.

The operation of the system of FIG. 14 will now be described with reference to FIGS. 16 through 18.

Figure 16:
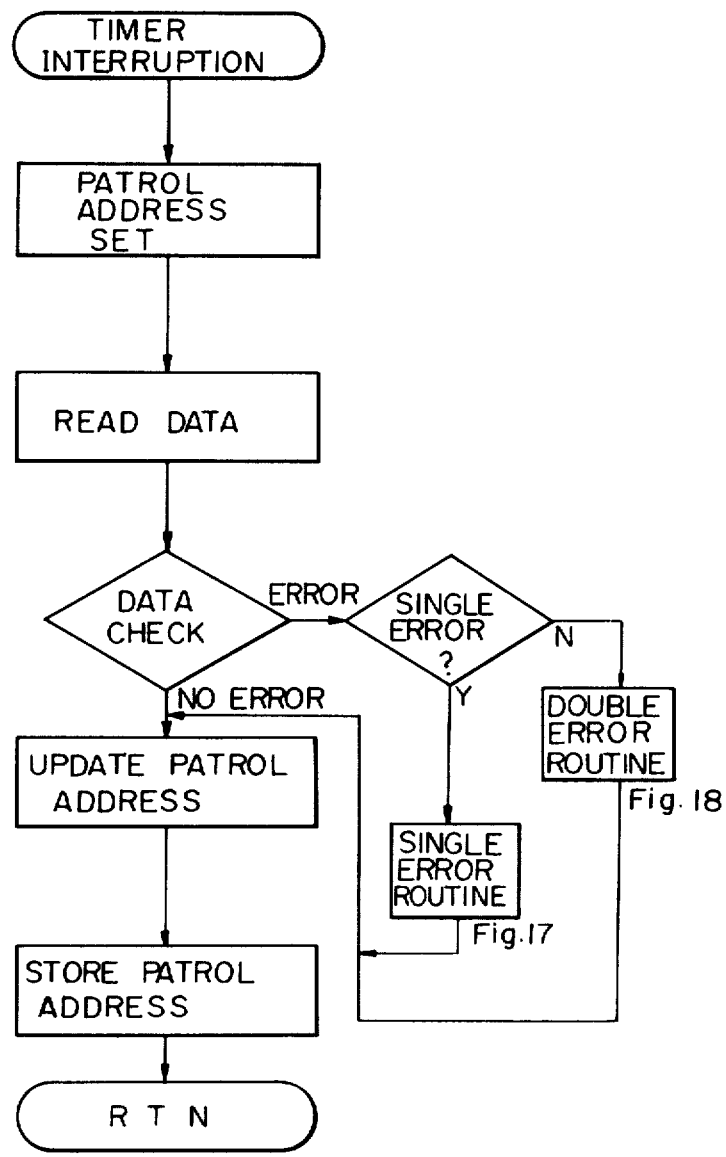
FIG. 16 depicts a flow chart used for explaining the patrol operation of the system of FIG. 14.

FIG. 16 is a flow chart used for explaining the patrol routine of the system of FIG. 14. In the data processing system of FIG. 14, the error processing is executed by a microinstructions stored in the microprogram storage and control unit 140. Let it be assumed that the alternate operation is executed only when a burst error occurs.

In the first step of the patrol routine, the data processing unit A is stopped from accessing the main memory M by updating an interval timer (not shown). The time interval of the interval timer is, in this embodiment, about 3.3 milliseconds. When this interruption occurs, the patrol routine is started. The patrol routine is executed by a microprogram.

In the second step, the patrol address stored in the local storage LS is set in the first address selecting circuit AS'. At the first cycle of this patrol routine, the address stored in the local storage LS is "0".

In the third step, data is read from the main memory by using the address set in the first address selecting circuit AS'. Then, the read data is set in the read data selecting circuit RS.

In the fourth step, the data set in the read data selecting circuit RS is checked by the syndrome generating circuit SG and the syndrome memory circuit SM. As a result of this check, if a single bit error is detected, a single-bit error routine is executed as illustrated in FIG. 17. As a result of this check, if a double bit error is detected, a double bit error routine is executed as illustrated in FIG. 18. If no error is detected in this check, the patrol address is updated in the fifth step.

Then in the sixth step, the updated patrol address is stored in the local storage.

After the sixth step, the patrol routine returns to the next step of the interruption time of the interval timer to wait for an interruption to update the interval timer.

It should be noted that, when a single-bit error is detected in the fourth step, a corrected data corrected by the read data correcting circuit DC is automatically rewritten into the same address of the main memory where the single-bit error has occured. Also, the error address and the error syndrome are restored in the local storage LS. Then, the single-bit error routine is executed.

Figure 17:
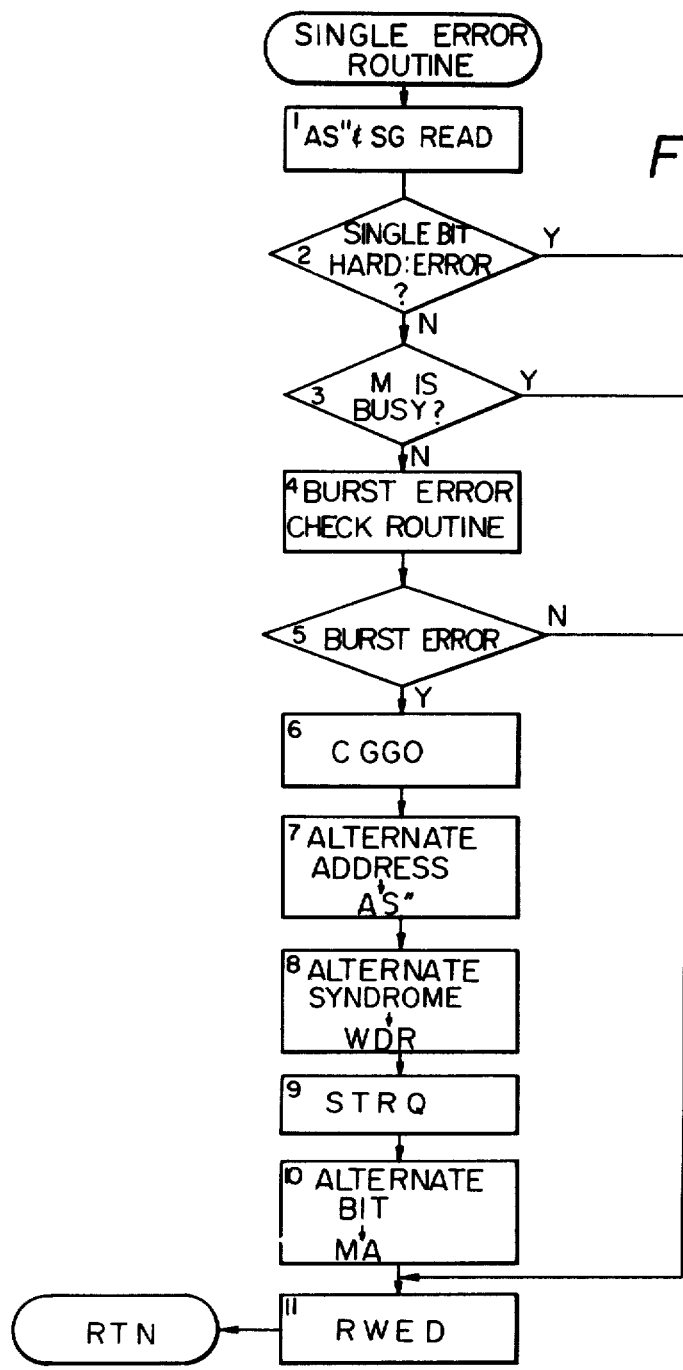
FIG. 17 depicts a flow chart used for explaining the single-bit error processing routine in the system of FIG. 14.

FIG. 17 is a flow chart used for explaining the single-bit error routine. When a single-bit error is detected during the time the data processing unit A is accessing the main memory M or during the time the patrol routine is being executed, the single-bit error routine is executed.

In the first step of the single-bit error routine, the error address and the error syndrome are read from the second address selecting circuit AS'' and the syndrome generating circuit SG, respectively.

In the second step, the error address and the error syndrome are compared with those stored in the local storage LS, respectively. As a result of the comparison, if they coincide, the single-bit error is, according to this second embodiment, recognized as a hard error and the single-bit error routine returns control to the patrol routine of FIG. 16. If the error address does not coincide with the error address stored in the local storage LS and the error syndrome does not coincide with the error syndrome stored in the local storage LS, that is, if the single-bit error is not a hard error, the main memory M is checked as to whether it is being accessed by the data processing unit A in the third step by using the signal CBSY (FIG. 15). If the main memory M is being accessed by the data processing unit A, this single-bit error routine returns control to the patrol routine of FIG. 16. If the main memory M is not being accessed by the data processing unit A, a burst-error check routine is executed in the fourth step. The burst-error check is executed for the all addresses in one chip in which the single-bit error is detected.

After the burst-error check, if the same error-syndrome pattern is not detected in the fifth step, the single-bit error is recognized as an intermittent error and the single-bit error routine returns control to the patrol routine of FIG. 16. After the burst-error check, if the same error-syndrome pattern is detected in the fifth step, the single-bit error is recognized as a burst error. Then, an alternate operation is executed.

In the alternate operation, which is illustrated in the steps 6 through 11 of the flow chart of FIG. 17, the alternate memory MA is checked to see whether it is being accessed by the data processing unit A after detecting the burst error. If the alternate memory MA is not being accessed by the data processing unit A, an alternate control routine is executed.

In the first step of the alternate control routine, which is the step 6 in FIG. 17, the signal CGGO is applied from the data processing unit A to the alternate operation control circuit TC (FIG. 15) for starting the alternate operation. Then, in the step 7, the alternate address is set in the second address selecting circuit AS''. Then, in the step 8, the alternate syndrome is set in a write data register WDR, one input of which is connected to the local storage LS and the output of which is connected through the line $l_1$, to the write data selecting circuit WS. Then, in the step 9, the signal STRQ is applied from the data processing unit A to the alternate operation control circuit TC to request alternate control. After that, in the step 10, the alternate bit is stored in the alternate memory. Then, in the step 11, the signal RWED is applied from the data processing unit A to the circuit TC for terminating the alternate operation. At that time the alternate control routine is completed.

Figure 18:
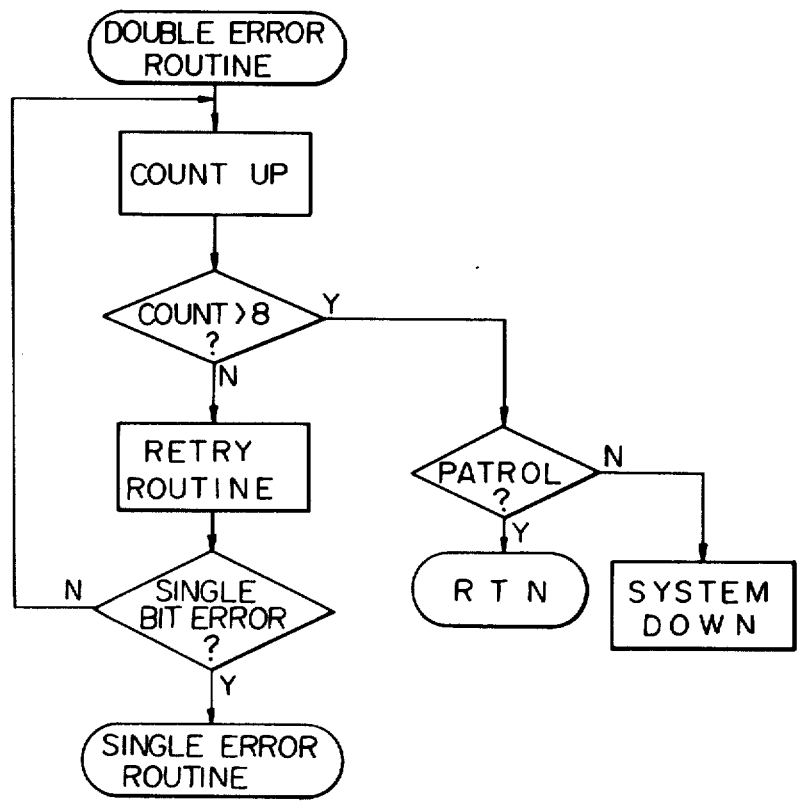
FIG. 18 depicts a flow chart used for explaining the double-bit error processing routine in the system of FIG. 14.

FIG. 18 is a flow chart used for explaining the double-bit error routine. When a double-bit error is detected during the time the data processing unit A is accessing the main memory M or during the time the patrol routine is executed, the double-bit error routine is executed.

As illustrated in FIG. 18, a plurality of retry operations are executed. Each retry operation includes a rewriting operation and a rereading operation. In this second embodiment, the retry operations are executed eight times. In the retry operations, if a two or more bit error is detected every time by the syndrome generating circuit and syndrome memory, the double-bit error is recognized as an uncorrectable error. When it is not corrected in the retry operation by the read data correcting circuit DC, the data processing system is brought to a system down status. In the patrol operation, the 2-bit error processing is completed and, as a result, no processing is executed. In the retry operations, if a single-bit hard error is detected in an error syndrome, the process is branched to return to the 1-bit error processing routine.

In this second embodiment, the local storage LS is used for the alternate control and patrol operations and has a flag area for indicating the status of the alternate memory, an area for storing the patrol address, another flag area for indicating the validity of the patrol operation, and another area for storing a single-bit hard error. In the second embodiment, although it has been assumed that the alternate operation is executed only when a burst error occurs, alternatively, the alternate operation may be executed when a single bit hard error occurs. Also, the number of retry operations is not restricted to eight, but may be any number required.

From the foregoing description of the embodiments of the present invention, it will be understood that, according to the present invention, since a soft error is detected before an alternate operation is executed, the possibility of a system down status of a data processing system occurring due to hard errors, burst errors, soft errors, hard errors plus soft errors, or burst errors plus soft errors, is greatly decreased. Also, since the alternate memory is not used when soft errors occur, the size of the alternate memory can be small.

We claim:

1. A data processing system, comprising:
 a main memory;
 a data processing unit, operatively connected to said main memory, for processing data stored in said main memory;
 an error processing unit, operatively connected to said data processing unit and said main memory, for processing error data read from said main memory, said data processing unit being interrupted from accessing said main memory during a time said error processing unit is accessing said main memory, said error processing unit including an error storing means for storing the error data read from said main memory;

error informing means, operatively connected to said main memory and said error storing means, for informing said error storing means of said error data;

data correcting means, operatively connected to said main memory and said error informing means, for correcting data read from said main memory so as to output a corrected data when said error data is detected in data read from said main memory;

an alternate memory, operatively connected to said error processing unit and said data correcting means, for storing said corrected data under the control of said error processing unit;

said error processing unit further comprising access determining means included in said error processing unit, operatively connected to said main memory, said error informing means and said error storing means, for determining whether said error processing unit should access said main memory in response to said error data stored in said error storing means;

error analyzing means, operatively connected to said error informing means and said error processing unit, for analyzing error data read from said main memory (M), alternate-operation control means, operatively connected to said error analyzing means and said error informing means, for determining whether said corrected data should be stored in said alternate memory in response to the result of the error analysis by said error analyzing means; and data switching means, operatively connected to said alternate memory, said data processing unit, said error analyzing means, said error processing unit and said data correcting means, for transferring said corrected data stored in said alternate memory to said data processing unit when said error processing unit determines to alternate an error generating portion in said main memory with said alternate memory as a result of the error analysis.

2. A data processing system as claimed in claim 1, wherein said error processing unit further comprises a counter for generating patrol start signals having a predetermined frequency, said patrol start signals being used to start said error processing by said error processing unit.

3. A data processing system as claimed in claim 2, wherein alternating the error generating portion in said main memory with said alternate memory being an alternate operation, and wherein said patrol start signals being generated when said alternate operation is to be executed.

4. A data processing system as claimed in claim 1, wherein said error processing unit further comprises first means, operatively connected to said error analyzing means, for recognizing whether said error data is a correctable error or an uncorrectable error.

5. A data processing system as claimed in claim 4, wherein said access determining means comprises second means, operatively connected to said first means and said main memory, for accessing said main memory when said first means recognizes said error data as a correctable error.

6. A data processing system as claimed in claim 5, wherein said error analyzing means comprises comparing means, operatively connected to said error informing means and said error processing unit, for comparing previously read data with currently read data to output a coincidence signal when the previously read and currently read data coincide.

7. A data processing system as claimed in claim 6, wherein said alternate-operation control means comprises control means, operatively connected to said second means and said comparing means, for storing said corrected data in said alternate memory when said alternate-operation control means receives said coincidence signal.

8. A data processing system, comprising:

a main memory;

a data processing unit, operatively connected to said main memory, for processing data stored in said main memory;

a microprogram-controlled error processing unit, operatively connected to said data processing unit and said main memory, for processing error data read from said main memory, said data processing unit being interrupted from accessing said main memory during a time said microprogram-controlled error processing unit is accessing said main memory, said microprogram-controlled error processing unit including an error storing means for storing said error data read from said main memory;

error informing means, operatively connected to said main memory and said error processing unit, for informing said error storing means of said error data;

data correcting means, operatively connected to said main memory and said error informing means, for correcting data read from said main memory so as to output corrected data when said error data is detected in the data read from said main memory;

an alternate memory, operatively connected to said error processing unit and said data correcting means, for storing said corrected data under the control of said microprogram-controlled error processing unit;

said error processing unit further comprising access determining means, operatively connected to said main memory, said error informing means and said error storing means, for determining whether said microprogram-controlled error processing unit should access said main memory in response to said error data stored in said error storing means;

error analyzing means, operatively connected to said error informing means and said error processing unit, for analyzing said error data read from said main memory;

alternate-operation control means, operatively connected to said error processing unit, said alternate memory and said error analyzing means, for determining whether said corrected data should be stored in said alternate memory in response to the result of the analysis by said error analyzing means; and data switching means, operatively connected to said alternate memory, said data processing unit, said error processing unit and said data correcting means, for transferring said corrected data stored by said microprogram-controlled error processing unit in said alternate memory to said data processing unit.

9. An error processing method employing a main memory, a data processing unit, a microprogram control unit and an alternate memory, comprising the steps of:

processing data stored in the main memory by accessing said main memory by means of the data processing unit;

patroling said main memory at a predetermined time interval by means of the microprogram control unit by interrupting said step of processing data;

executing a correctable error routine when a correctable error is detected in said step of processing data or in said step of patrolling;

executing an uncorrectable error routine when an uncorrectable error is detected in said step of processing data or in said step of patrolling; and executing an alternate operation for storing correct data in the alternate memory when said correctable error is recognized as a predetermined-type error in said correctable error routine.

10. An error processing method as claimed in claim 9, wherein said predetermined-type error is a single-bit hard error.

11. An error processing method as claimed in claim 9, wherein said predetermined-type error is a burst error.

12. An error processing method as claimed in claim 10, wherein said correctable error routine comprises the steps of:

rewriting correct data into an address of said main memory where said correctable error has been detected;

accessing said address by means of said microprogram control unit; and analyzing said correctable error to determine whether said correctable error is a single-bit hard error or a soft error.

13. An error processing method as claimed in claim 11, wherein said correctable error routine comprises the steps of:

rewriting correct data into at least one address of said main memory different from an address where said correctable error has been detected;

accessing said at least one address by means of said microprogram control unit; and analyzing said correctable error to determine whether said correctable error is a burst error or a soft error.

14. A data processing system, comprising:

a data processing unit;

a main memory, operatively connected to said data processing unit, for storing data;

an alternate memory, operatively connected to said data processing unit, for storing corrected data;

an error processing unit, operatively connected to said data processing unit, said main memory and said alternate memory, for generating an inhibit signal that prevents said data processing unit from accessing said main memory or said alternate memory;

a read data selecting circuit, operatively connected to said main memory and said alternate memory, for selecting the alternate memory when said main memory outputs error data and for passing therethrough the error data;

a syndrome generating circuit, operatively connected to said read data selecting circuit and said error processing unit, for generating an error syndrome and an error signal which indicates an error when said read data selecting circuit outputs the error data;

a syndrome memory, operatively connected to said read data selecting circuit, said syndrome generating circuit, and said error processing unit, for generating a selection signal controlling said read data selecting circuit when the error data is detected at least twice by said syndrome generating circuit and for generating a coincidence signal indicating the error data has been detected at least twice; and a read data correcting circuit, operatively connected to said syndrome generating circuit, said read data selecting circuit, said data processing unit, said main memory and said alternate memory, for generating the corrected data from the error data output by said read data selecting circuit in dependence upon the error syndrome;

said error processing unit controlling the storage of the corrected data in said main memory or said alternate memory in dependence upon the error signal and the coincidence signal.

15. A data processing system as claimed in claim 14, wherein said error processing unit comprises:

error storing means, operatively connected to said syndrome generating circuit, for storing the error data output by said main memory;

access determining means, operatively connected to said main memory and said alternate memory, said syndrome generating circuit and said error storing means, for determining whether said data processing unit accesses said main memory or said alternate memory;

counter means, operatively connected to said access determining means, for determining an access frequency of said main memory; and correctable determining means, operatively connected to said main memory, said alternate memory, said syndrome generating circuit and said syndrome memory, for determining whether the error data is correctable.

16. A data processing system as claimed in claim 14, wherein said error processing unit comprises a microprogram controlled error processing unit.

17. An error processing method employing a data processing unit, local storage, a main memory and an alternate memory, comprising the steps of:

(a) generating an inhibit signal;
(b) retrieving a patrol address from local storage and applying it to the main memory;
(c) reading out data from the main memory based on the patrol address;
(d) determining if the data read out contains an error;
(e) proceeding to step (j) if the data read out does not contain an error;
(f) determining if the error is a single bit error or a double bit error;
(g) executing a single error routine if the error is a single bit error;
(h) executing a double error routine if the error is a double bit error;
(j) updating the patrol address; and
(k) storing the updated patrol address in the local storage.

18. An error processing method is claimed in claim 17, wherein step (g) comprises the steps of:

(i) determining if the single bit error is a hard error;
(ii) proceeding to step (xi) if the single bit error is a hard error;
(iii) determining if the main memory is busy;
(iv) proceeding to step (xi) if the main memory is busy;

(v) executing a burst error check routine to determine if the single bit error is a burst error;
(vi) proceeding to step (xi) if the single bit error is not a burst error;
(vii) determining if the alternate memory is busy;
(viii) proceeding to step (xi) if the alternate memory is busy;
(ix) applying an alternate address to the alternate memory;
(x) storing a corrected bit in the alternate memory; and
(xi) returning to step (h).

19. A data processing method as claimed in claim 17, wherein step (h) comprises the steps of:
(i) setting a count to zero;
(ii) incrementing the count;
(iii) determining if the count is greater than a predetermined number;
(iv) proceeding to step (xi) if the count is greater than the predetermined number;
(v) reading out data from the main memory based on the patrol address;
(vi) comparing the data read out with the data previously read out;
(vii) writing correct data into the main memory;
(viii) determining on the basis of step (vi) if the error is a single bit error;
(ix) proceeding to step (g) if the error is a single bit error;
(x) proceeding to step (ii) if the error is not a single bit error;
(xi) determining if the data processing unit should be place in a system down status;
(xii) returning to step (j) if the data processing system should not be placed in the system down status; and
(xiii) placing the data processing system in the system down status.

* * * * *

UNITED STATES PATENT AND TRADEMARK OFFICE
CERTIFICATE OF CORRECTION

PATENT NO. : 4,456,993        Page 1 of 3

DATED : JUNE 26, 1984

INVENTOR(S) : SHOZO TANIGUCHI ET AL.

It is certified that error appears in the above-identified patent and that said Letters Patent is hereby corrected as shown below:

```
FRONT PAGE [57] ABSTRACT
                line 3, "(M)" should be deleted;
                line 3, "(A)" should be deleted;
                line 4, "(EP)" should be deleted.

Col. 1, line 55, "occuring" should be --occurring--;
       line 57, "occuring" should be --occurring--;
       line 60, "occuring" should be --occurring--.

Col. 2, line 9, "occuring" should be --occurring--.

Col. 3, line 6, "means and" should be --means; and--.

Col. 4, line 27, "2B is" should be --2B, is a--.

Col. 5, line 59 "(not shown) in Fig. 1)" should be
                --(not shown in Fig. 1)--.

Col. 6, line 51, "occured" should be --occurred--.

Col. 7, line 50, delete "flip-flop" (second occurrence);
                "the FF" should be --the flip-flop FF--;
                "FFO" should be --FF0--.
```

UNITED STATES PATENT AND TRADEMARK OFFICE
CERTIFICATE OF CORRECTION

PATENT NO. : 4,456,993

DATED : JUNE 26, 1984

INVENTOR(S) : SHOZO TANIGUCHI ET AL.

It is certified that error appears in the above-identified patent and that said Letters Patent is hereby corrected as shown below:

Col. 8, line 42, after "and" insert --A6 and--;
~~line 53,~~ "117" should be --117--.

Col. 9, line 3, "made" should be --mode--;
line 11, "states" should be --status--;
line 40, before "FF4" insert --flip-flop--;
line 41, delete "flip-flop";
line 63, "k-input" should be --K-input--.

Col. 10, line 16, "k-inputs" should be --K-inputs--;
line 25, delete "used to stop";
line 25, "Al" should be --A1--; and after "A1" insert --used to stop--.

Col. 11, line 4, "k-inputs" should be --K-inputs--;
line 32, "preseting" should be --presetting--.

Col. 12, line 7, "circuits" should be --circuit--;
line 67, delete "the" (second occurrence).

UNITED STATES PATENT AND TRADEMARK OFFICE
CERTIFICATE OF CORRECTION

PATENT NO. : 4,456,993
DATED : JUNE 26, 1984
INVENTOR(S) : SHOZO TANIGUCHI ET AL.

It is certified that error appears in the above-identified patent and that said Letters Patent is hereby corrected as shown below:

Col. 14, line 48, "inteval" should be --interval--.

Col. 17, line 25, delete "(M)";

Col. 20, line 61, "is" should be --as--.

Signed and Sealed this

Thirtieth Day of April 1985

[SEAL]

Attest:

DONALD J. QUIGG

*Attesting Officer*     *Acting Commissioner of Patents and Trademarks*